(12) United States Patent
Shiokawa et al.

(10) Patent No.: US 10,593,388 B2
(45) Date of Patent: Mar. 17, 2020

(54) SPIN CURRENT MAGNETIZATION ROTATIONAL ELEMENT, MAGNETORESISTANCE EFFECT ELEMENT, AND MAGNETIC MEMORY

(71) Applicant: TDK CORPORATION, Tokyo (JP)

(72) Inventors: Yohei Shiokawa, Tokyo (JP); Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/080,848

(22) PCT Filed: Jan. 26, 2018

(86) PCT No.: PCT/JP2018/002466
§ 371 (c)(1),
(2) Date: Aug. 29, 2018

(87) PCT Pub. No.: WO2018/155077
PCT Pub. Date: Aug. 30, 2018

(65) Prior Publication Data
US 2019/0057732 A1    Feb. 21, 2019

(30) Foreign Application Priority Data
Feb. 27, 2017   (JP) ................... 2017-034758

(51) Int. Cl.
*G11C 11/16* (2006.01)
*H01L 43/04* (2006.01)
(Continued)

(52) U.S. Cl.
CPC .......... *G11C 11/161* (2013.01); *G11C 11/165* (2013.01); *H01L 21/8239* (2013.01);
(Continued)

(58) Field of Classification Search
None
See application file for complete search history.

(56) References Cited

U.S. PATENT DOCUMENTS 8,350,347 B2    1/2013  Gaudin et al.
2014/0056060 A1*  2/2014  Khvalkovskiy ....... H01L 27/228
                                                    365/158
(Continued)

FOREIGN PATENT DOCUMENTS

JP     2014-045196 A     3/2014
WO     2016/021468 A1    2/2016
(Continued)

OTHER PUBLICATIONS

Ioan Mihai Miron et al. "Perpendicular Switching of a Single Ferromagnetic Layer Induced by In-Plane Current Injection". Nature, Aug. 11, 2011, vol. 476, pp. 189-194.
(Continued)

*Primary Examiner* — James G Norman
(74) *Attorney, Agent, or Firm* — Oliff PLC

(57) ABSTRACT

A spin current magnetization rotational element includes: a first ferromagnetic metal layer for a magnetization direction to be changed; and a spin-orbit torque wiring. The spin-orbit torque wiring has a structure in which a spin conduction layer and an interfacial spin generation layer are alternately laminated in the first direction, the number of a plurality of the interfacial spin generation layers is two or greater, and in the spin-orbit torque wiring, one of the plurality of interfacial spin generation layers is closest to the first ferromagnetic metal layer.

19 Claims, 3 Drawing Sheets

(51) Int. Cl.
- *H01L 43/10* (2006.01)
- *H01L 27/22* (2006.01)
- *H01L 29/82* (2006.01)
- *H01L 43/08* (2006.01)
- *H01L 27/105* (2006.01)
- *H01L 21/8239* (2006.01)

(52) U.S. Cl.
CPC .......... *H01L 27/105* (2013.01); *H01L 27/222* (2013.01); *H01L 29/82* (2013.01); *H01L 43/04* (2013.01); *H01L 43/08* (2013.01); *H01L 43/10* (2013.01)

(56) References Cited

U.S. PATENT DOCUMENTS

| | | |
|---|---|---|
| 2015/0348606 A1 | 12/2015 | Buhrman et al. |
| 2017/0222135 A1* | 8/2017 | Fukami ................ H01L 43/08 |
| 2018/0123028 A1* | 5/2018 | Shiokawa ............ H01F 10/324 |
| 2019/0131517 A1 | 5/2019 | Shiokawa et al. |

FOREIGN PATENT DOCUMENTS

| | | |
|---|---|---|
| WO | 2017/155510 A1 | 9/2017 |
| WO | 2018/155078 A1 | 8/2018 |

OTHER PUBLICATIONS

S. Fukami et al. "A Spin-Orbit Torque Switching Scheme With Collinear Magnetic Easy Axis and Current Configuration". Nature Nanotechnology, Mar. 21, 2016, pp. 1-6.

Jairo Sinova et al. "Spin Hall Effects". Reviews of Modern Physics, Oct.-Dec. 2015, vol. 87, pp. 1213-1259.

Y.K. Kato et al. "Observation of the Spin Hall Effect in Semiconductors". Science Magazine, Dec. 10, 2004, vol. 306, pp. 1910-1913.

Luqiao Liu et al. "Spin Torque Switching With the Giant Spin Hall Effect of Tantalum". Science Magazine, 2012, vol. 336, pp. 1-19 and vol. 555, pp. 1-12.

Luqiao Liu et al. "Current-Induced Switching of Perpendicularly Magnetized Magnetic Layers Using Spin Torque From the Spin Hall Effect". Physical Review Letters, Aug. 31, 2012, vol. 109, pp. 096602-1 through 096602-5.

Ki-Seung Lee et al. "Threshold Current for Switching of a Perpendicular Magnetic Layer Induced by Spin Hall Effect". Applied Physics Letters, 2013, vol. 102, pp. 112410-1 through 112410-5.

Ki-Seung Lee et al. "Thermally Activated Switching of Perpendicular Magnet by Spin-Orbit Spin Torque". Applied Physics Letters, 2014, vol. 104, pp. 072413-1 through 072413-5.

Shunsuke Fukami et al. "Magnetization Switching by Spin-Orbit Torque in an Antiferromagnet-Ferromagnet Bilayer System". Nature Materials, May 2016, vol. 15, pp. 535-542.

S. Takahashi et al. "Spin Injection and Detection in Magnetic Nanostructures". Physical Review B, 2003, vol. 67, pp. 052409-1 through 052409-4.

Yeongkyo Seo et al. "Area-Efficient SOT-MRAM With a Schottky Diode". IEEE Electron Device Letters, Aug. 2016, vol. 37, No. 8, pp. 982-985.

Wei Zhang et al. "Spin Hall Effects in Metallic Antiferromagnets". Physical Review Letters, Nov. 7, 2014, vol. 113, pp. 196602-1 through 196602-6.

Jul. 25, 2019 Office Action issued in U.S. Appl. No. 16/091,240.

Apr. 10, 2018 International Search Report issued in International Application No. PCT/JP2018/002516.

Oct. 30, 2019 Search Report issued in European Patent Application No. 18757900.8.

* cited by examiner

SPIN CURRENT MAGNETIZATION ROTATIONAL ELEMENT, MAGNETORESISTANCE EFFECT ELEMENT, AND MAGNETIC MEMORY

TECHNICAL FIELD

The present disclosure relates to a spin current magnetization rotational element, and more particularly, to a spin current magnetization reversal element. In addition, the disclosure also relates to a magnetoresistance effect element and a magnetic memory.

Priority is claimed on Japanese Patent Application No. 2017-034758, filed Feb. 27, 2017, the content of which is incorporated herein by reference.

BACKGROUND ART

A giant magnetoresistive (GMR) element that is constituted by a multi-layer film of a ferromagnetic layer and a nonmagnetic layer, and a tunnel magnetoresistive (TMR) element using an insulating layer (a tunnel barrier layer, a barrier layer) as a nonmagnetic layer are known. Typically, the TMR element has higher element resistance in comparison to the GMR element, but a magnetoresistance (MR) ratio of the TMR element is greater than an MR ratio of the GMR element. According to this, the TMR element has attracted attention as an element for a magnetic sensor, a high-frequency component, a magnetic head, and a nonvolatile magnetoresistive random access memory (MRAM).

In the MRAM, data is read and written by using characteristics in which when magnetization directions of two ferromagnetic layers with an insulating layer interposed therebetween vary, element resistance of the TMR element varies. As a writing type of the MRAM, a type in which writing (magnetization reversal) is performed by using a magnetic field formed by a current, and a type in which writing (magnetization reversal) is performed by using spin transfer torque (STT) that occurs when a current is allowed to flow in a lamination direction of a magnetoresistance effect element are known. The magnetization reversal of the TMR element which uses STT is efficient from the viewpoint of energy efficiency, but a reversal current density for magnetization reversal is high. It is preferable that the reversal current density is low from the viewpoint of a long operational lifespan of the TMR element. This preference is also true of the GMR element.

Accordingly, in recent years, as means for reducing a reversal current with a mechanism different from the STT, a magnetization reversal type using a pure spin current generated by a spin Hall effect has attracted attention (for example, Non Patent Literature 1). The pure spin current, which is generated by the spin Hall effect, causes spin-orbit torque (SOT), and causes magnetization reversal by the SOT. The pure spin current is generated when the same numbers of upward spin electrons and the same number of downward spin electrons flow in directions opposite to each other, and flows of charges are canceled. According to this, a current that flows to a magnetoresistance effect element is zero, and thus realization of a magnetoresistance effect element having a small reversal current density is expected.

According to Non Patent Literature 2, it is reported that a reversal current density by the SOT type is approximately the same as a reversal current density by the STT type. However, the reversal current density that is reported in the current SOT type is not sufficient to realize high integration and low energy consumption, and thus there is room for improvement.

In addition, examples of a material that is used in the spin-orbit torque wiring (wiring that causes SOT and generates a pure spin current) of the magnetoresistance effect element of the SOT type include a heavy metal material including Ta that is used in Non Patent Literature 2. The heavy metal material has high electric resistivity. Therefore, when the heavy metal material is used as a thin film or a thin wire, there is a problem that power consumption is high.

CITATION LIST

Patent Literature

[Non Patent Literature 1]
 I. M. Miron, K. Garello, G Gaudin, P.-J. Zermatten, M. V Costache, S. Auffret, S. Bandiera, B. Rodmacq, A. Schuhl, and P. Gambardella, Nature, 476, 189 (2011)
[Non Patent Literature 2]
 S. Fukami, T. Anekawa, C. Zhang, and H. Ohno, Nature Nanotechnology, DOI:10.1038/NNANO. 2016. 29.
[Non Patent Literature 3]
 J. Sinova, S. O. Valenzuela, J. Wunderlich, C. H. Back, T. Jungwirth, Reviews of Modern Physic, 87, 1213 (2015)

SUMMARY

The disclosure has been made in consideration of the above-described problem, and an object thereof is to further reduce a current density of magnetization rotation or magnetization reversal by an SOT type, and to further reduce power consumption in comparison to the related art.

The present inventors paid particular attention to an interface Rashba effect that occurs in an interface between different kinds of materials, and a spin Hall effect in a heavy metal material among various principals which are considered as a cause for exhibiting SOT, and they conceived a configuration in which the both effects are effectively combined and a low-resistance material is used.

Accordingly, the disclosure provides the following means to achieve the aforementioned object.

(1) According to an aspect of the disclosure, there is provided a spin current magnetization rotational element including: a first ferromagnetic metal layer for a magnetization direction to be changed; and a spin-orbit torque wiring which extends in a second direction intersecting a first direction that is a plane-orthogonal direction of the first ferromagnetic metal layer, the first ferromagnetic metal layer being located on one surface of the spin-orbit torque wiring. The spin-orbit torque wiring has a structure in which a spin conduction layer and an interfacial spin generation layer are alternately laminated in the first direction, the number of a plurality of the interfacial spin generation layers is two or greater, and in the spin-orbit torque wiring, one of the plurality of interfacial spin generation layers is closest to the first ferromagnetic metal layer. In addition, the spin current magnetization rotation element according to the aspect of the disclosure may include: a first ferromagnetic metal layer for a magnetization direction to be changed; and a spin-orbit torque wiring which extends in a second direction intersecting a first direction that is a plane-orthogonal direction of the first ferromagnetic metal layer, and which is joined to the first ferromagnetic metal layer. The spin-orbit torque wiring may have a structure in which a spin conduction layer and an interfacial spin generation layer are alternately laminated in the first direction, the number of the plurality of interfacial spin generation layers may be two or greater, and in the spin-orbit torque wiring, one of the plurality of interfacial spin generation layers may be joined to the first ferromagnetic metal layer.

(2) In the spin current magnetization rotational element according to (1), the thickness of each of the plurality of interfacial spin generation layers may be two or less times an atomic radius of an atom that constitutes the interfacial spin generation layer.

(3) In the spin current magnetization rotational element according to (1) or (2), the spin conduction layer may be constituted by a material that includes at least any one kind of element among Al, Si, Cu, Ag, GaAs, and Ge.

(4) In the spin current magnetization rotational element according to any one of (1) to (3), the plurality of interfacial spin generation layers may be constituted by a material that includes any element among Mo, Ru, Rh, Pd, Ta, W, Ir, Pt, Au, or Bi.

(5) In the spin current magnetization rotational element according to any one of (1) to (4), the thickness of the spin conduction layer may be equal to or less than a spin diffusion length of the spin conduction layer.

(6) In the spin current magnetization rotational element according to any one of (1) to (5), among the plurality of interfacial spin generation layers, the thickness of the interfacial spin generation layer closest to the first ferromagnetic metal layer may be smaller than the thickness of the other interfacial spin generation layers.

(7) In the spin current magnetization rotational element according to any one of (1) to (6), a plurality of the spin conduction layers may be constituted by materials different from each other in a state in which each of the interfacial spin generation layers is interposed between the plurality of spin conduction layers, and among the plurality of spin conduction layers, a spin resistivity of a spin conduction layer close to the first ferromagnetic metal layer may be smaller than a spin resistivity of a spin conduction layer distant from the first ferromagnetic metal layer.

(8) In the spin current magnetization rotational element according to any one of (1) to (7), when viewed from the first direction, a cross-sectional area of the interfacial spin generation layer closest to the first ferromagnetic metal layer may be smaller than a cross-sectional area of the other interfacial spin generation layers which are not closest to the first ferromagnetic metal layer. In addition, in the spin current magnetization rotational element according to any one of (1) to (7), when viewed from the first direction, a cross-sectional area of the interfacial spin generation layer that is in contact with the first ferromagnetic metal layer may be smaller than a cross-sectional area of the other interfacial spin generation layers which are not in contact with the first ferromagnetic metal layer.

(9) In the spin current magnetization rotational element according to any one of (1) to (8), the thickness of the spin-orbit torque wiring may be 20 nm or less.

(10) According to another aspect of the disclosure, there is provided a magnetoresistance effect element including: the spin current magnetization rotational element according to any one of (1) to (9); a second ferromagnetic metal layer in which a magnetization direction is fixed; and a nonmagnetic layer that is interposed between the first ferromagnetic metal layer and the second ferromagnetic metal layer.

(11) According to still another aspect of the disclosure, there is provided a magnetic memory including a plurality of magnetoresistance effect elements according to (10).

According to the spin current magnetization rotational element of the disclosure, it is possible to provide a spin current magnetization rotational element that causes magnetization rotation due to a pure spin current to occur in an effective combination of an interface Rashba effect and a spin Hall effect.

DESCRIPTION OF EMBODIMENTS

Hereinafter, the disclosure will be described in detail with reference to the accompanying drawings. Drawings used in the following description may illustrate a characteristic portion in an enlarged manner for easy understanding of characteristics of the disclosure for convenience, and dimensional ratios and the like of respective constituent elements may be different from actual dimensional ratios and the like. Materials, dimensions, and the like which are exemplified in the following description are illustrative only, and the disclosure is not limited thereto. The disclosure can be carried out by appropriately making modifications in a range that exhibits an effect of the disclosure. In elements of the disclosure, another layer may be provided in a range that exhibits the effect of the disclosure.

(Spin Current Magnetization Rotational Element)

Figure 1A:
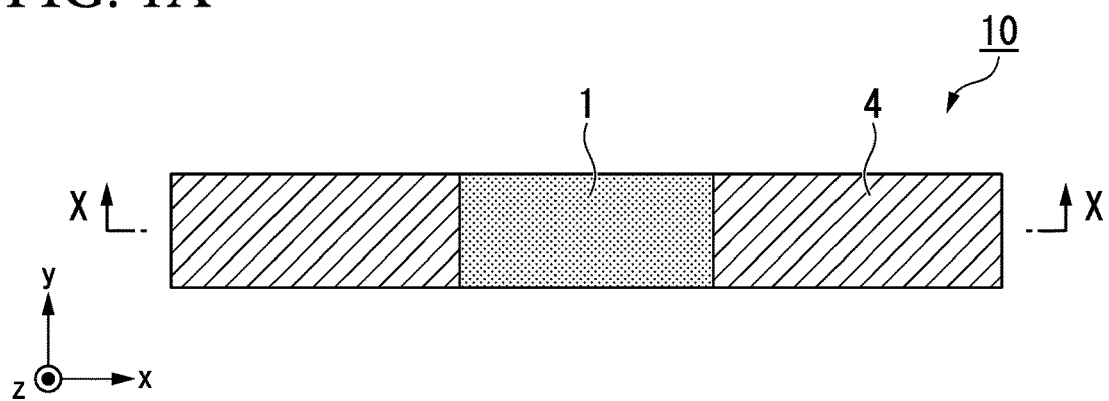
FIG. 1A is a schematic view illustrating a spin current magnetization rotational element according to an embodiment of the disclosure, and is a plan view of the spin current magnetization rotational element.
Figure 1B:
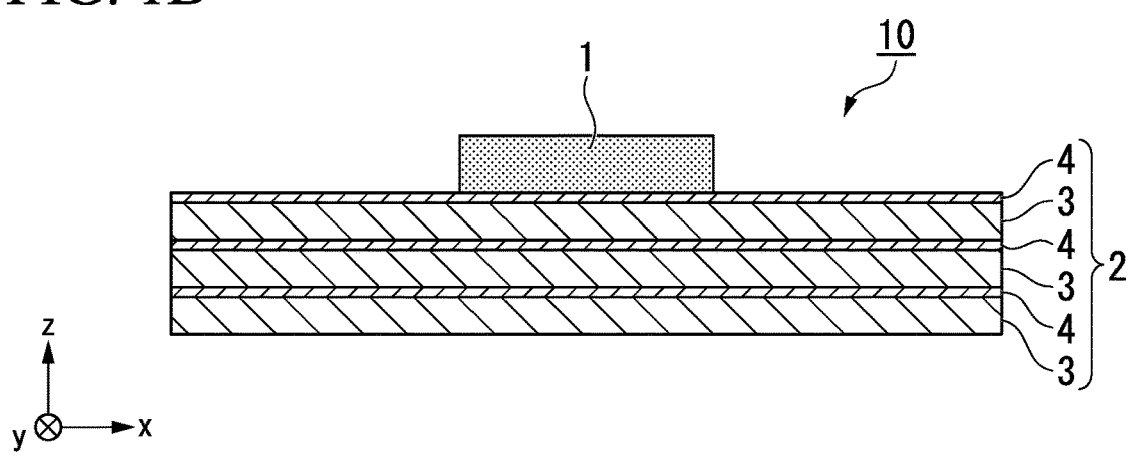
FIG. 1B is a schematic view illustrating the spin current magnetization rotational element according to the embodiment of the disclosure, and is a cross-sectional view of the spin current magnetization rotational element in FIG. 1A.

FIGS. 1A and 1B are schematic views illustrating an example of a spin current magnetization rotational element according to an embodiment of the disclosure. FIG. 1A is a plan view, and FIG. 1B is a cross-sectional view taken along line X-X that is a central line of a spin-orbit torque wiring 2 in FIG. 1A in a width direction.

A spin current magnetization rotational element 10 illustrated in FIGS. 1A and 1B includes a first ferromagnetic metal layer 1 for a magnetization direction to be changed, and the spin-orbit torque wiring 2 that extends in a second direction intersecting a first direction that is a plane-orthogonal direction of the first ferromagnetic metal layer, and is joined to the first ferromagnetic metal layer 1. The spin-orbit torque wiring 2 has a structure in which a spin conduction layer 3 and an interfacial spin generation layer 4 are alternately laminated in the first direction. The number of a plurality of the interfacial spin generation layers 4 is two or greater. One of the plurality of interfacial spin generation layers 4 is joined to the first ferromagnetic metal layer.

A plane-orthogonal direction of the first ferromagnetic metal layer 1, or a direction (first direction) in which the first ferromagnetic metal layer 1 and the spin-orbit torque wiring 2 are laminated is set as a z direction, and a direction (second direction) that is orthogonal to the z direction and is parallel to the spin-orbit torque wiring 2 is set as an x direction, and a direction (third direction) that is orthogonal to the x direction and the z direction is set as a y direction. In addition, a direction, which is orthogonal to a surface that is joined to the spin-orbit torque wiring 2 in the first ferromagnetic metal layer 1 or a surface that faces the spin-orbit torque wiring 2, is set as a plane-orthogonal direction of the first ferromagnetic metal layer 1. In addition, in the z direction (first direction), a direction from the spin-orbit torque wiring 2 to the first ferromagnetic metal layer 1 is set as an upward direction of the z direction, and a direction from the first ferromagnetic metal layer 1 to the spin-orbit torque wiring 2 is set as a downward direction of the z direction.

In the following description including FIGS. 1A and 1B, as an example of a configuration in which the spin-orbit torque wiring 2 extends in a direction intersecting the first direction that is the plane-orthogonal direction of the first ferromagnetic metal layer 1, description will be given of a case of a configuration extending in a direction that is orthogonal to the first direction.

The spin current magnetization rotational element 10 of this embodiment, that is, an element that performs magnetization rotation of a ferromagnetic metal layer by an SOT effect by a pure spin current can be used in a magnetoresistance effect element that performs magnetization reversal of the ferromagnetic metal layer by only SOT due to the pure spin current, and in this case, the spin current magnetization rotational element can be particularly referred to as "spin current magnetization reversal element". In addition, the spin current magnetization rotational element of this embodiment can be used in a magnetoresistance effect element that uses STT in the related art as assist means or main means of magnetization reversal of the ferromagnetic metal layer.

<First Ferromagnetic Metal Layer>

The first ferromagnetic metal layer 1 includes a known ferromagnetic material so that a magnetization direction varies. With regard to more details of the first ferromagnetic metal layer 1, description will be given in association with a first ferromagnetic metal layer 101 in an application of the following magnetoresistance effect element.

<Spin-Orbit Torque Wiring>

The spin-orbit torque wiring 2 has a configuration in which when a current flows, a pure spin current is generated to cause the spin-orbit torque. The spin-orbit torque wiring 2 of this embodiment has a structure in which a spin conduction layer 3 and an interfacial spin generation layer 4 are alternately laminated in the first direction.

At an interface between the spin conduction layer 3 and the interfacial spin generation layer 4, spin accumulation (a state in which either an upward spin or a downward spin is rich) occurs due to an interface Rashba effect. The spin accumulation causes the pure spin current to occur.

Although a detailed mechanism of the interface Rashba effect is not clear, the mechanism is considered as follows. At an interface between different kinds of materials, it is considered that space reversal symmetry collapses and thus a potential gradient exists in a plane-orthogonal direction (direction orthogonal to the interface). In a case where a current flows along an interface in which the potential gradient exists in the plane-orthogonal direction, that is, in a case where electrons move in a two-dimensional plane, an effective magnetic field acts on spins in an in-plane direction orthogonal to a movement direction of electrons, and thus a direction of the spin is arranged in the effective magnetic field. According to this, spin accumulation occurs in the interface. In addition, the spin accumulation causes a pure spin current, which is diffused to the outside of a plane, to occur.

In this embodiment, in addition to the interface Rashba effect, a spin Hall effect, which occurs in the interfacial spin generation layer 4, particularly, at the inside of the interfacial spin generation layer 4 that is joined to the first ferromagnetic metal layer 1, is also used to generate the pure spin current.

The spin Hall effect is a phenomenon in which when a current flows to a material, a pure spin current is caused in a direction orthogonal to a direction of the current on the basis of spin orbit interaction.

Figure 2:
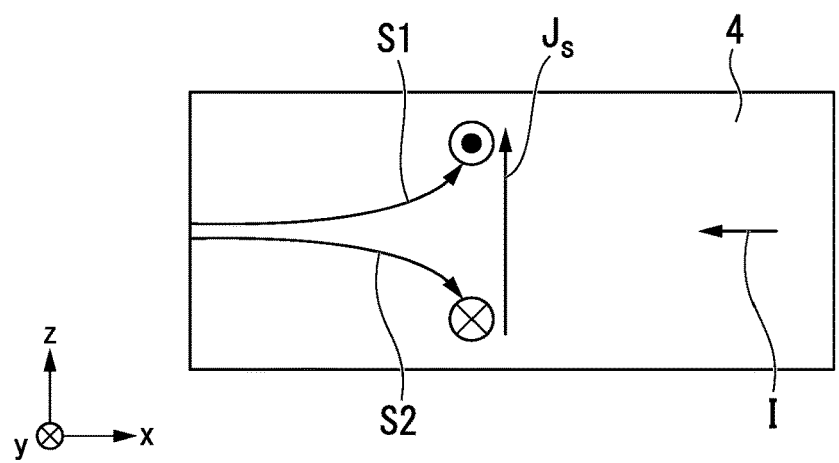
FIG. 2 is a schematic view illustrating a spin Hall effect.

FIG. 2 is a schematic view illustrating the spin Hall effect. FIG. 2 is a cross-sectional view obtained by cutting the interfacial spin generation layer 4 illustrated in FIGS. 1A and 1B, for example, the interfacial spin generation layer 4 that is joined to the first ferromagnetic metal layer 1 in the x-direction (that is, in an xz plane). Description will be given of a mechanism in which the pure spin current is generated due to the spin Hall effect with reference to FIG. 2.

As illustrated in FIG. 2, when a current I is allowed to flow in an extension direction of the interfacial spin generation layer 4, a first spin S1 that is oriented to a front side on a paper surface and a second spin S2 that is oriented to a back side on the paper surface are curved in a direction orthogonal to the current. A typical Hall effect and the spin Hall effect are common in that a movement (migration) direction of moving (migrating) charges (electrons) can be curved. However, in the typical Hall effect, when receiving a Lorentz force, the movement direction of charged particles, which move in a magnetic field, can be curved. In contrast, in the spin Hall effect, although the magnetic field does not exist, only when an electron migrates (only when a current flows), the migration direction of the electron can be curved. In this regard, the typical Hall effect and the spin Hall effect are greatly different from each other.

In a nonmagnetic substance (a material that is not a ferromagnetic substance), the number of electrons of the first spin S1 and the number of electrons of the second spin S2 are the same as each other. Accordingly, the number of electrons of the first spin S1 that faces upward in the drawing, and the number of electrons of the second spin S2 that faces downward are the same as each other. According to this, a current as a net flux of charges is zero. A spin current that is not accompanied with the current is particularly referred to as "pure spin current".

In a case where a current is allowed to flow through a ferromagnetic substance, the first spin S1 and the second spin S2 are curved in directions opposite to each other. In this regard, the nonmagnetic substance and the ferromagnetic substance are the same as each other. On the other hand, in the ferromagnetic substance, either the first spin S1 or the second spin S2 is rich, and as a result, a net flux of charges occurs (a voltage occurs). In this regard, the non-magnetic substance and the ferromagnetic substance are different from each other. Accordingly, as will be described later, as a material of the interfacial spin generation layer 4, a material composed of a ferromagnetic substance alone is not included, and particularly, a nonmagnetic heavy metal material can be exemplified.

Here, when a flow of electrons of the first spin S1 is set as $J_\uparrow$, a flow of electrons of the second spin S2 is set as and a spin current is set as $J_S$, $J_S$ is defined as $J_\uparrow - J_\downarrow$. In FIG. 2, $J_S$ as the pure spin current flows upward in the drawing. Here, $J_S$ represents a flow of electrons in which polarizability is 100%.

In FIGS. 1A and 1B, when the first ferromagnetic metal layer 1, which is a ferromagnetic substance, is brought into contact with an upper surface of the spin-orbit torque wiring 2, the pure spin current that is generated at the interface due to the interface Rashba effect and the pure spin current that is generated inside the first ferromagnetic metal layer 1 due to the spin Hall effect are diffused and transferred at the inside the spin-orbit torque wiring 2, and reach the first ferromagnetic metal layer 1. The pure spin currents are diffused and flow into the first ferromagnetic metal layer 1. That is, a spin is injected into the first ferromagnetic metal layer 1.

In the spin current magnetization rotational element 10 of this embodiment, as described above, a current is allowed to flow to the spin-orbit torque wiring 2 to generate a pure spin current, and the pure spin current is diffused to the first ferromagnetic metal layer 1 that is in contact with the spin-orbit torque wiring 2. Accordingly, magnetization rotation of the first ferromagnetic metal layer 1 occurs by a spin-orbit torque (SOT) effect due to the pure spin current. When the SOT effect is sufficiently large, magnetization of the first ferromagnetic metal layer 1 is reversed. In this case, the spin current magnetization rotational element of this embodiment can be particularly referred to as "spin current magnetization reversal element".

(Spin Conduction Layer)

The spin conduction layer 3 is constituted by a material that has low electric resistivity for lowering of electric resistance, and a long spin diffusion length (a distance in which the spin accumulation disappears) for conduction of a spin current to the first ferromagnetic metal layer 1. For example, examples of a material that constitutes the spin conduction layer 3 include materials including at least one kind of element among Al, Si, Cu, Ag, GaAs, and Ge. The materials of the spin conduction layer 3 may be used as an elementary substance, or in combination thereof as an alloy, a compound, and the like.

It is preferable that the thickness of the spin conduction layer 3 is set to be equal to or lower than the spin diffusion length of the spin conduction layer 3. According to this, it is possible to transfer the spin current to the first ferromagnetic metal layer 1 without losing spin information. Particularly, the spin diffusion length depends on a material that is used. For example, it is known that a spin diffusion length of Cu and Ag which are elementary substances reaches 100 nm or greater at room temperature. Non Patent Literature 3 reported that the spin diffusion length of a Cu crystal that is an elementary substance reaches 500 µm at room temperature, and the spin diffusion length of an Ag crystal that is an elementary substance reaches 700 µm at room temperature. Accordingly, it is possible to set the thickness of the spin conduction layer 3 to be equal to or less than the spin diffusion length. In addition, as described in Non Patent Literature 3, the spin diffusion length of various kinds of materials are known to those skilled in the art already, or can be estimated by those skilled in the art. It should be understood that those skilled in the art can set the thickness of the spin conduction layer to be equal to or less than the spin diffusion length on the basis of the disclosure of this specification in a case of using various kinds of materials.

(Interfacial Spin Generation Layer)

The interfacial spin generation layer 4 is constituted by a material that generates large spin-orbit torque (SOT). As the material, a nonmagnetic heavy metal, for example, materials including least one kind of element among Mo, Ru, Rh, Pd, Ta, W, Ir, Pt, Au, and Bi can be exemplified, and the materials of the interfacial spin generation layer 4 may be used as an elementary substance or as in combination thereof as an alloy, a compound, and the like.

The material (heavy metal) that constitutes the interfacial spin generation layer 4 has a spin diffusion length shorter than that of the material (wiring material) that constitutes the spin conduction layer 3. Accordingly, the thickness of the interfacial spin generation layer 4 is set to be small so that a spin current passes through the interfacial spin generation layer 4 and reaches the first ferromagnetic metal layer 1 without losing spin information.

Particularly, the thickness of the interfacial spin generation layer 4 is set to be two or less times an atomic radius of an atom that constitutes the interfacial spin generation layer 4. Here, as to be typically recognized by those skilled in the art, the atomic radius represents the half of the minimum interatomic distance in a crystal that is an elementary substance.

The thickness that is two or less times the atomic radius includes a thickness of a monoatomic layer corresponding to a thickness that is accurately two times the atomic radius, and a thickness that is smaller than the thickness of the monoatomic layer. Here, the thickness smaller than the thickness of the monoatomic layer represents that an open hole exists in the layer, that is, an open pore exists, and thus an average thickness of the entirety of the layer is smaller than a thickness that is two times the atomic radius. In the interfacial spin generation layer 4 having the open hole, a spin current is likely to conduct through the hole and is likely to be generated. In other words, the interfacial spin generation layer 4 may not constitute a perfect layer and may be a layer that is included in the spin conduction layer 3, for example, a layer that is doped inside the spin conduction layer 3. In a case of the very thin interfacial spin generation layer 4, the interfacial spin generation layer 4 is formed from an elementary substance of the above-described elements.

To allow the pure spin current to pass through the interfacial spin generation layer 4, in addition to the structure in which the thickness of the interfacial spin generation layer 4 is set to be as small as possible, another structure can be considered. For example, as an alternative structure of the interfacial spin generation layer 4, a structure in which thin wires (strips) are arranged, a mesh-shaped structure, or a mechanically punched structure is considered. Even in the structures, the pure spin current can effectively pass through the interfacial spin generation layer 4. Particularly, in a case where the interfacial spin generation layer 4 is mechanically punched, it is possible to control a positional distribution of punched holes. As a result, it is possible to control a flow of the spin current that passes through the interfacial spin generation layer 4. Accordingly, this case is preferable.

In FIGS. 1A and 1B, three spin conduction layers 3 and three interfacial spin generation layers 4 are alternately laminated to form a six-layer structure (the spin conduction layer 3, the interfacial spin generation layer 4, the spin conduction layer 3, the interfacial spin generation layer 4, the spin conduction layer 3, and the interfacial spin generation layer 4 in this order from a lower side in the drawings), and the interfacial spin generation layer 4 that is located at the uppermost layer in the first direction (z direction) is joined to the first ferromagnetic metal layer 1. In the six-layer structure, or a structure in which the number of layers is set to six or greater, two or more interfacial spin generation layers 4 exist, and the number of interfaces is effectively increased. Accordingly, spin accumulation is enlarged and as a result, a spin current is enlarged. As a result, it is possible to realize the magnetization rotation (magnetization reversal) with a small current.

Figure 3A:
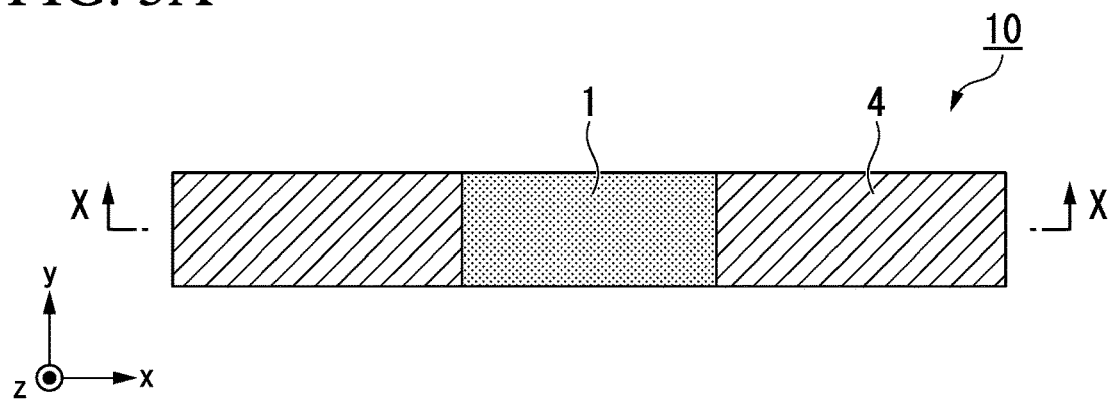
FIG. 3A is a schematic view illustrating a spin current magnetization rotational element according to another embodiment of the disclosure, and is a plan view of the spin current magnetization rotational element.
Figure 3B:
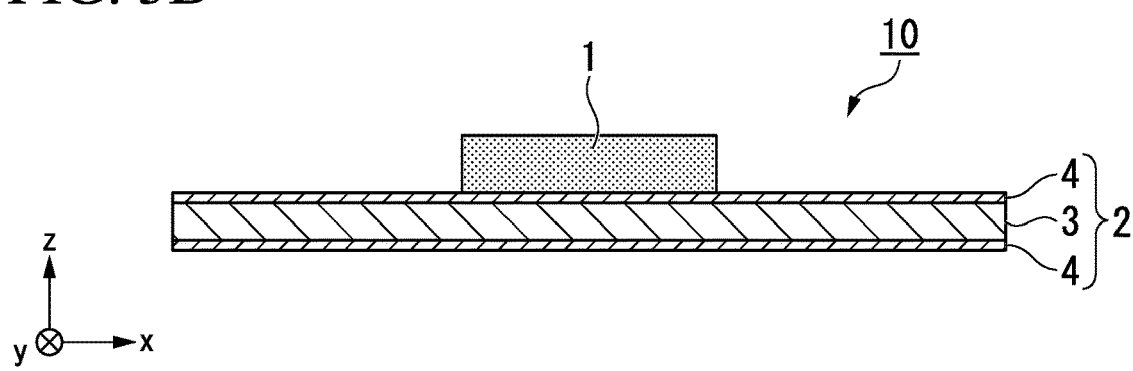
FIG. 3B is a schematic view illustrating a spin current magnetization rotational element according to the embodiment of the disclosure, and is a cross-sectional view of the spin current magnetization rotational element in FIG. 3A.
Figure 4A:
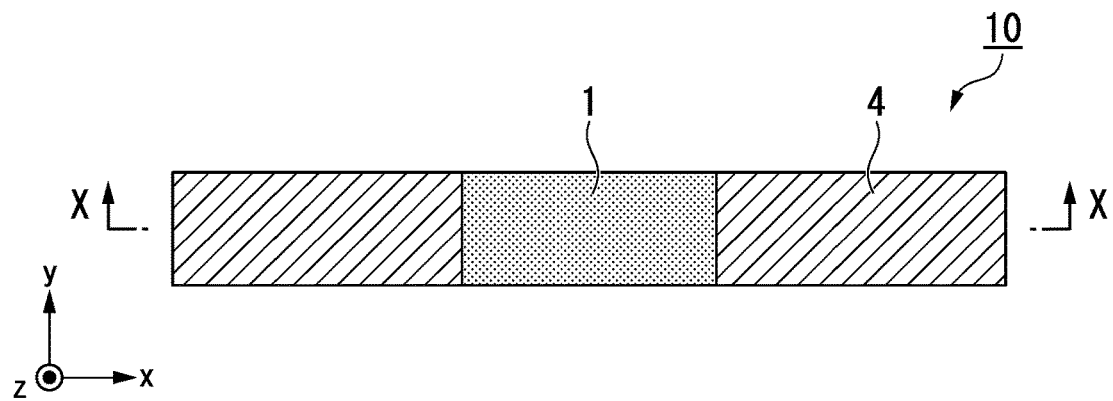
FIG. 4A is a schematic view illustrating a spin current magnetization rotational element according to still another embodiment of the disclosure, and is a plan view of the spin current magnetization rotational element.
Figure 4B:
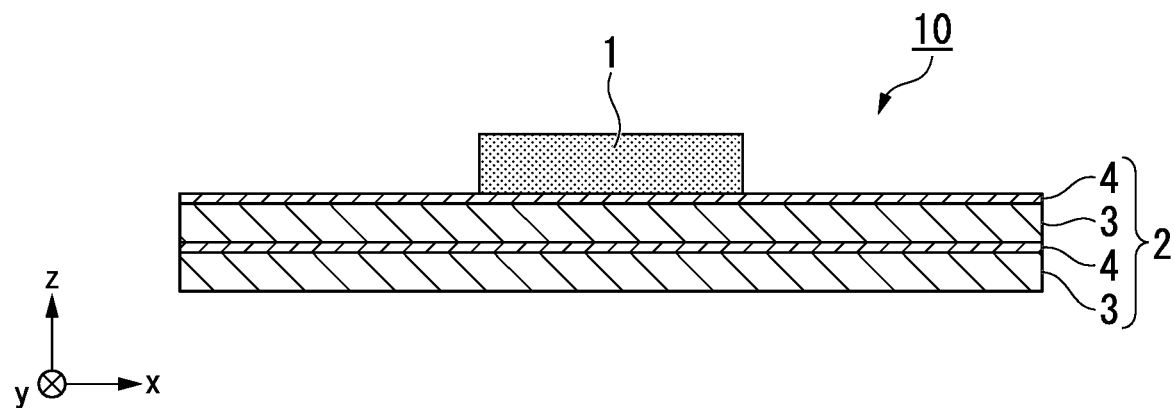
FIG. 4B is a schematic view illustrating the spin current magnetization rotation element according to the embodiment of the disclosure, and is a cross-sectional view of the spin current magnetization rotational element in FIG. 4A.

However, the disclosure is not limited to the above-described six-layer structure. The number of a plurality of the spin conduction layers 3 and the number of a plurality of the interfacial spin generation layers 4, which are alternately laminated, can be changed as long as the interfacial spin generation layer 4 that is located at the uppermost layer (the interfacial spin generation layer 4 that is located at the uppermost layer in the first direction (z direction)) is joined to the first ferromagnetic metal layer 1. For example, in another embodiment of the disclosure as illustrated in FIGS. 3A and 3B, two interfacial spin generation layers 4 and one spin conduction layer 3 are alternately laminated to form a three-layer structure (the interfacial spin generation layer 4, the spin conduction layer 3, and the interfacial spin generation layer 4 in this order from a lower side in the drawings). In addition, in still another embodiment of the disclosure as illustrated in FIGS. 4A and 4B, two spin conduction layers 3 and two interfacial spin generation layers 4 are alternately laminated to form a four-layer structure (the spin conduction layer 3, the interfacial spin generation layer 4, the spin conduction layer 3, the interfacial spin generation layer 4 in this order from a lower side in the drawings). Even in the structures, since two or more interfacial spin generation layers 4 exist, it is possible to enlarge the spin current.

In addition, in the laminated structure of the spin conduction layer 3 and the interfacial spin generation layer 4, a plurality of the spin conduction layers 3 may not have the same thickness, and a plurality of the interfacial spin generation layer 4 may not have the same thickness. In other words, the plurality of spin conduction layers 3 may have thicknesses different from each other, and the plurality of interfacial spin generation layers 4 may have thicknesses different from each other. For example, in a case where the plurality of interfacial spin generation layers 4 exist, it is preferable that the thickness of an interfacial spin generation layer 4 that exists at a position closest to the first ferromagnetic metal layer 1 (that is, the interfacial spin generation layer 4 that is located at the uppermost layer in the first direction (z direction) is set to be smaller than the thickness of the other interfacial spin generation layers 4. Here, in a case where all of the thicknesses of the plurality of interfacial spin generation layers 4 are two or less times an atomic radius, the configuration in which the thickness of one of the interfacial spin generation layers 4 is set to be smaller than the thickness of the other interfacial spin generation layers 4 represents that the one interfacial spin generation layer 4 has relatively many defects (holes). According to this, a pure spin current that is generated at the interface between the other interfacial spin generation layers 4 located in lower layers and the spin conduction layers 3 is promoted to pass through the interfacial spin generation layer 4 that is located at the uppermost portion, and to reach the first ferromagnetic metal layer 1.

In addition, the plurality of spin conduction layers 3 may not be constituted by the same material, and the plurality of interfacial spin generation layer 4 may not be constituted by the same material. In other words, the plurality of spin conduction layers 3 may be constituted by materials different from each other, and the plurality of interfacial spin generation layers 4 may be constituted by materials different from each other. For example, two spin conduction layers 3 with one interfacial spin generation layer 4 interposed therebetween may be constituted by materials different from each other. In this case, a material is selected so that spin resistivity (flowing hardness of the spin current) of a spin conduction layer 3, which is close to the first ferromagnetic metal layer 1 (spin conduction layer that is located on an upward side in the first direction (z direction)), becomes smaller than spin resistivity of a spin conduction layer 3 that is distant from the first ferromagnetic metal layer 1 (a spin conduction layer that is located on a downward side in the first direction (z direction)). For example, since Cu has spin resistivity higher than that of Ag, the spin conduction layer 3 that is close to the first ferromagnetic metal layer 1 is constituted by Ag, and the spin conduction layer 3 that is distant from the first ferromagnetic metal layer 1 is constituted by Cu. According to this, the pure spin current that is generated at an interface between the spin conduction layer 3 that is located on a downward side and the interfacial spin generation layer 4 is reflected by a material with high spin resistivity, and faces the first ferromagnetic metal layer 1 on an upward side.

In addition, the plurality of spin conduction layers 3 may have areas or cross-sectional areas different from each other, and the plurality of interfacial spin generation layers 4 may have areas or cross-sectional areas different from each other. Particularly, when viewed from the first direction (z direction), a cross-sectional area of the interfacial spin generation layer 4 that is in contact with (or closest to) the first ferromagnetic metal layer 1 may be set to be smaller than a cross-sectional area of the other interfacial spin generation layers 4 that is not in contact with (or is not closest to) the first ferromagnetic metal layer 1. Particularly, the interfacial spin generation layer 4 that is in contact with the first ferromagnetic metal layer 1 may be set to exist only on a lower side (on a downward side in the z direction) of the first ferromagnetic metal layer 1. With regard to a pure spin current that is generated on a side other than the lower side of the first ferromagnetic metal layer 1, in a case where the first ferromagnetic metal layer 1 does not exist on an upper side of the interfacial spin generation layer 4, a spin diffusion length of the interfacial spin generation layer 4 is short, and thus spins are scattered, and spin information disappears. As a result, the pure spin current is invalid as energy. Accordingly, when the interfacial spin generation layer 4 that is in contact with the first ferromagnetic metal layer 1 exists only on a lower side of the first ferromagnetic metal layer 1, the spin conduction layers 3 on a side other than the lower side of the first ferromagnetic metal layer 1 are in contact with the interlayer insulating film, and thus the pure spin current is reflected and is injected into the first ferromagnetic metal layer 1. According to this, it is possible to enhance energy efficiency.

Preferably, the thickness of each of the spin conduction layers 3 and the thickness of each of the interfacial spin generation layers 4 are set so that the thickness of the spin-orbit torque wiring 2 that is a staked body of the layers becomes 20 nm or less. When the thickness exceeds 20 nm and is too large, interfacial roughness between the spin-orbit torque wiring 2 and the first ferromagnetic metal layer 1 that is laminated thereon becomes large, and thus there is a possibility that a magnetoresistance effect may not be stable. A lower limit of the thickness of the spin-orbit torque wiring 2 is preferably 1 nm, and the thickness of the spin-orbit torque wiring 2 is more preferably 2 nm to 10 nm, but there is no limitation thereto.

The spin current magnetization rotational element 10 may further include an insulating layer that is in contact with a surface of the spin-orbit torque wiring 2 which is opposite to a surface that is in contact with the first ferromagnetic metal layer 1. In this configuration, in a case of being applied to a magnetoresistance effect element or a usage other than the magnetoresistance effect element, a current, which is allowed to flow the spin-orbit torque wiring 2, is prevented from being leaked to the surface opposite to the surface that is in contact with the first ferromagnetic metal layer 1, and thus it is possible to further enhance a current concentration effect.

In the above-described embodiment, description has been given of a case where the spin-orbit torque wiring is directly connected to the first ferromagnetic metal layer. However, as will be described later, another layer such as a cap layer may be interposed between the first ferromagnetic metal layer and the spin-orbit torque wiring. That is, it is possible to employ a configuration in which the first ferromagnetic metal layer is located on one surface of the spin-orbit torque wiring, and in the spin-orbit torque wiring, one of the interfacial spin generation layers is closest to the first ferromagnetic metal layer. More details of the cap layer will be described in association with a cap layer 104 in the following application of the magnetoresistance effect element.

As will be described later, the spin current magnetization rotational element of this embodiment is applicable to a magnetoresistance effect element. The use is not limited to the magnetoresistance effect element, and application to another use is also possible. With regard to the other use, for example, the spin current magnetization rotational element may be used in a spatial optical modulator in which the spin current magnetization rotational element is disposed in respective pixels to spatially modulate incident light by using a magneto-optical effect. In addition, a magnetic field, which is applied to an axis of easy magnetization of a magnet to avoid a hysteresis effect due to coercivity of a magnet in a magnetic sensor, may be substituted with SOT.

(Magnetoresistance Effect Element)

A magnetoresistance effect element according the embodiment of the disclosure includes the spin current magnetization rotational element of the embodiment of the disclosure, a second ferromagnetic metal layer in which a magnetization direction is fixed, and a nonmagnetic layer that is interposed between the first ferromagnetic metal layer and the second ferromagnetic metal layer.

Figure 5:
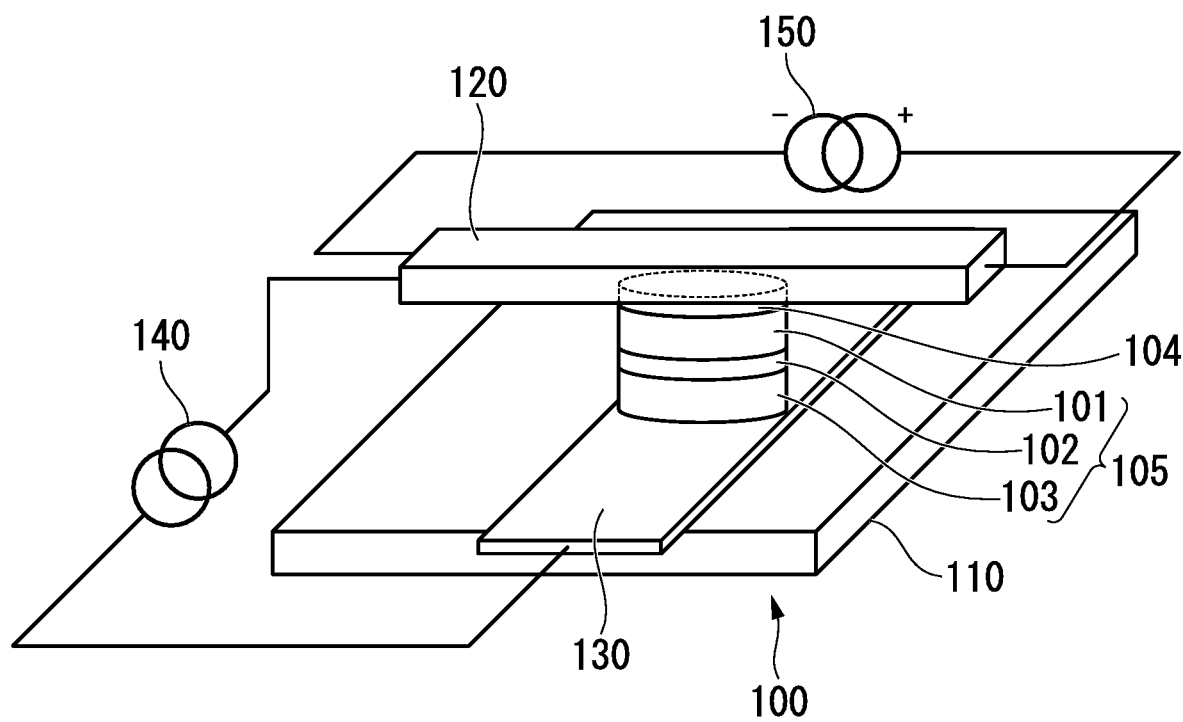
FIG. 5 is a perspective view schematically illustrating a magnetoresistance effect element according to an embodiment of the disclosure.

FIG. 5 is an application example of the spin current magnetization rotational element of the disclosure, and is a perspective view schematically illustrating a magnetoresistance effect element according to an embodiment of the disclosure. Furthermore, in FIG. 5, characteristic portions of the spin current magnetization rotational element of the disclosure are not illustrated.

A magnetoresistance effect element 100 illustrated in FIG. 5 includes the spin current magnetization rotational element (a first ferromagnetic metal layer 101 and a spin-orbit torque wiring 120) according to the embodiment of the disclosure, a second ferromagnetic metal layer 103 in which a magnetization direction is fixed, and a nonmagnetic layer 102 that is interposed between the first ferromagnetic metal layer 101 and the second ferromagnetic metal layer 103. The first ferromagnetic metal layer 101 has the same configuration as in the first ferromagnetic metal layer 1, and the spin-orbit torque wiring 120 has the same configuration as in the spin-orbit torque wiring 2. In addition, it can be said that the magnetoresistance effect element 100 illustrated in FIG. 5 includes a magnetoresistance effect element part 105 (the first ferromagnetic metal layer 101, the nonmagnetic layer 102, and the second ferromagnetic metal layer 103) and the spin-orbit torque wiring 120.

The magnetoresistance effect element according to the embodiment of the disclosure includes the spin-orbit torque wiring 120, and may have a configuration in which magnetization reversal of the magnetoresistance effect element is performed with SOT alone due to the pure spin current (hereinafter, may be referred to as "SOT-alone" configuration), or a configuration in which in the magnetoresistance effect element using STT of the related art, SOT due to the pure spin current is used in combination.

In the following description including FIG. 5, as an example of a configuration in which the spin-orbit torque wiring 120 extends in a direction intersecting a lamination direction of the magnetoresistance effect element part 105, description will be given of a case of a configuration extending in an orthogonal direction.

In FIG. 5, a wiring 130 through which a current flows in the lamination direction of the magnetoresistance effect element 100, and a substrate 110 that forms the wiring 130 are also illustrated. In addition, the magnetoresistance effect element 100 includes a cap layer 104 that is provided between the first ferromagnetic metal layer 101 and the spin-orbit torque wiring 120.

<Magnetoresistance Effect Element Part>

The magnetoresistance effect element part 105 includes the second ferromagnetic metal layer 103 in which a magnetization direction is fixed, the first ferromagnetic metal layer 101 for a magnetization direction to be changed, and the nonmagnetic layer 102 that is interposed between the second ferromagnetic metal layer 103 and the first ferromagnetic metal layer 101.

Since magnetization of the second ferromagnetic metal layer 103 is fixed in one direction, and the magnetization direction of the first ferromagnetic metal layer 101 relatively varies, the magnetoresistance effect element part 105 functions as a magnetoresistance effect element. In an application to coercivity difference type (pseudo spin valve type) MRAM, coercivity of the second ferromagnetic metal layer is greater than coercivity of the first ferromagnetic metal layer, and in an application to an exchange bias type (spin valve type) MRAM, in the second ferromagnetic metal layer, the magnetization direction is fixed due to exchange coupling with an antiferromagnetic layer.

In addition, in a case where the nonmagnetic layer 102 is formed from an insulator, the magnetoresistance effect element part 105 is a tunneling magnetoresistive element (TMR) element, and in a case where the nonmagnetic layer 102 is formed from a metal, the magnetoresistance effect element part 105 is a giant magnetoresistive (GMR) element.

With regard to the magnetoresistance effect element part 105 of this embodiment, a configuration of a known magnetoresistance effect element part can be used. For example, each layer may include a plurality of layers, or another layer such as an antiferromagnetic layer configured to fix the magnetization direction of the second ferromagnetic metal layer may be provided.

The second ferromagnetic metal layer 103 is called a fixed layer, a pin layer, a reference layer, and the like, and the first ferromagnetic metal layer 101 is called a free layer, a storage layer, and the like.

The second ferromagnetic metal layer 103 and the first ferromagnetic metal layer 101 may be an in-plane magnetization film in which the magnetization direction is an in-plane direction parallel to a layer, or an orthogonal magnetization film in which the magnetization direction is a direction orthogonal to a layer.

As a material of the second ferromagnetic metal layer 103, a known material can be used. For example, a metal that is selected from the group consisting of Cr, Mn, Co, Fe, and Ni, and alloys which include one or more kinds of the metals and exhibit ferromagnetism can be used. In addition, alloys which include the metals, and at least one or more kinds of elements among B, C, and N, can be used. Specific examples thereof include Co—Fe, and Co—Fe—B.

In addition, it is preferable to use a Heusler alloy such as $Co_2FeSi$ to obtain a relatively higher output. The Heusler alloy includes an intermetallic compound having a chemical composition of $X_2YZ$. Here, X represents a transition metal element or a noble metal element of a group of Co, Fe, Ni, or Cu in a periodic table, Y represents a transition metal of a group of Mn, V, Cr, or Ti and can also employ element species of X, and Z is a typical element of a group III to a group V. Examples of the Heusler alloy include $Co_2FeSi$, $Co_2MnSi$, $Co_2Mn_{1-a}Fe_aAl_bSi_{1-b}$, and the like.

In addition, to further increase coercivity of the second ferromagnetic metal layer 103 with respect to the first ferromagnetic metal layer 101, as a layer (pinning layer) that is in contact with the second ferromagnetic metal layer 103 on a surface opposite to a surface that is in contact with the nonmagnetic layer 102, a layer of an antiferromagnetic material such as IrMn and PtMn may be provided. Specifically, the layer may be provided between the second ferromagnetic metal layer 103 and the wiring 130. In addition, it is possible to employ a synthetic ferromagnetic coupling structure so that a leakage magnetic field of the second ferromagnetic metal layer 103 does not have an effect on the first ferromagnetic metal layer 101.

In addition, in a case where the magnetization direction of the second ferromagnetic metal layer 103 is set to orthogonal to a lamination surface, it is preferable to use a laminated film of Co and Pt. Specifically, the second ferromagnetic metal layer 103 may be set to [Co (0.24 nm)/Pt (0.16 nm)]6/Ru (0.9 nm)/[Pt (0.16 nm)/Co (0.16 nm)]4/Ta (0.2 nm)/FeB (1.0 nm).

As a material of the first ferromagnetic metal layer 101, a ferromagnetic material, particularly, a soft-magnetic material can be applied. For example, a metal selected from the group consisting of Cr, Mn, Co, Fe, and Ni, an alloy that includes one or more kinds of the metals, an alloy that includes the metals and at least one or more elements among B, C, and N, and the like can be used. Specific examples thereof include Co—Fe, Co—Fe—B, and Ni—Fe.

In a case where a magnetization direction of the first ferromagnetic metal layer 101 is set to be orthogonal to a lamination surface, it is preferable that the film thickness of the first ferromagnetic metal layer is set to 2.5 nm or less. According to this, at an interface between the first ferromagnetic metal layer 101 and the nonmagnetic layer 102, it is possible to apply orthogonal magnetic anisotropy to the first ferromagnetic metal layer 101. In addition, when the film thickness of the first ferromagnetic metal layer 101 is set to be large, an effect of the interface orthogonal magnetic anisotropy is attenuated, and thus it is preferable that the film thickness of the first ferromagnetic metal layer 101 is set to be small. In addition, it is preferable that the thickness of the first ferromagnetic metal layer is 0.5 nm or greater, and more preferably 0.5 nm to 2.0 nm, but there is no limitation to the ranges.

A known material can be used for the nonmagnetic layer 102. For example, in a case where the nonmagnetic layer 102 is constituted by an insulator (that is, in a case of a tunnel barrier layer), as a material thereof, $Al_2O_3$, $SiO_2$, Mg, and $MgAl_2O_4$ and the like can be used. In addition, in addition to these materials, materials in which a part of Al, Si, and Mg is substituted with Zn, Be, and the like, and the like can be used. Among these, MgO or $MgAl_2O_4$ is a material capable of realizing a coherent tunnel, and thus it is possible to efficiently inject a spin. In addition, in a case where the nonmagnetic layer 102 is constituted by a metal, as a material thereof, Cu, Au, Ag, and the like can be used.

In addition, it is preferable that the cap layer 104 is formed on a surface opposite to the nonmagnetic layer 102 of the first ferromagnetic metal layer 101 as illustrated in FIG. 5. The cap layer 104 can suppress diffusion of elements from the first ferromagnetic metal layer 101. In addition, the cap layer 104 also contributes to a crystal orientation of each layer of the magnetoresistance effect element part 105. As a result, when the cap layer 104 is provided, magnetism of the second ferromagnetic metal layer 103 and the first ferromagnetic metal layer 101 of the magnetoresistance effect element part 105 is stabilized, and thus it is possible to realize a reduction in resistance of the magnetoresistance effect element part 105.

In the cap layer 104, a high-conductivity material is preferably used. For example, Ru, Ta, Cu, Ag, Au, and the like can be used. It is preferable that a crystal structure of the cap layer 104 is appropriately set to a face centered cubic (fcc) structure, a hexagonal closest packing (hcp) structure, or a body centered cubic (bcc) structure in accordance with a crystal structure of the ferromagnetic metal layer that is adjacent to the cap layer 104.

In addition, it is preferable to use any one selected from the group consisting of Ag, Cu, Mg, and Al in the cap layer 104. Although details will be described later, in a case where the spin-orbit torque wiring 120 and the magnetoresistance effect element part 105 are connected through the cap layer 104, it is preferable that the cap layer 104 does not scatter a spin that propagates from the spin-orbit torque wiring 120. It is known that silver, copper, magnesium, aluminum, and the like has a spin diffusion length is as long as 100 nm or greater, and thus the spin is less likely to be scattered.

It is preferable that the thickness of the cap layer 104 is equal to or less than a spin diffusion length of a material that constitutes the cap layer 104. When the thickness of the cap layer 104 is equal to or less than the spin diffusion length, it is possible to sufficiently transfer the spin that propagates from the spin-orbit torque wiring 120 to the magnetoresistance effect element part 105. In addition, when the spin of the spin-orbit torque wiring can be injected into the first ferromagnetic metal layer, a layer other than the cap layer 104 may be interposed between the first ferromagnetic metal layer and the spin-orbit torque wiring. Examples of the layer include Ag, Cu, Mg, and Al which have a thickness of approximately 0.5 to 2.0 nm.

<Substrate>

It is preferable that the substrate 110 is excellent in flatness. To obtain a surface with excellent flatness, it is possible to use a material, for example, Si, AlTiC, and the like.

An underlayer (not illustrated) may be formed on a surface of the substrate 110 on the magnetoresistance effect element part 105 side. When the underlayer is provided, it is possible to control crystallinity such as a crystal orientation and a crystal grain size of respective layers including the second ferromagnetic metal layer 103 that is laminated on the substrate 110.

It is preferable that the underlayer has an insulating property in order for a current flowing to a wiring 130 and the like not to be scattered. As the underlayer, various layers can be used. For example, as one example, a nitride layer, which has a (001)-oriented NaCl structure and includes at least one element selected from the group consisting of Ti, Zr, Nb, V, Hf, Ta, Mo, W, B, Al, and Ce, can be used in the underlayer.

As another example, it is possible to use a (002)-oriented perovskite-based conductive oxide layer expressed by a composition formula of $XYO_3$ can be used in the underlayer. Here, a site X includes at least one element selected from the group consisting of Sr, Ce, Dy, La, K, Ca, Na, Pb, and Ba, and a site Y includes at least one element that is selected from the group consisting of Ti, V, Cr, Mn, Fe, Co, Ni, Ga, Nb, Mo, Ru, Ir, Ta, Ce, and Pb.

As still another example, it is possible to use an oxide layer that has a (001)-oriented NaCl structure and includes at least one element selected from the group consisting of Mg, Al, and Ce in the underlayer.

As still another example, it is possible to use a layer that has a (001)-oriented tetragonal structure or cubic structure, and includes at least one element selected from the group consisting of Al, Cr, Fe, Co, Rh, Pd, Ag, Ir, Pt, Au, Mo, and W as the underlayer.

In addition, the underlayer is not limited to a monolayer, and a plurality of the layers in the examples may be laminated. Through examination of a configuration of the underlayer, it is possible to enhance crystallinity of each layer of the magnetoresistance effect element part 105, and thus it is possible to improve magnetic characteristics.

<Wiring>

The wiring 130 is electrically connected to the second ferromagnetic metal layer 103 of the magnetoresistance effect element part 105, and in FIG. 5, the wiring 130, the spin-orbit torque wiring 120, and a power supply (not illustrated) constitute a closed circuit, and thus a current flows in a lamination direction of the magnetoresistance effect element part 105.

A material of the wiring 130 is not particularly limited as long as the material has high conductivity. For example, aluminum, silver, copper, gold, and the like can be used.

In the embodiment, description has been given of an example of a so-called bottom pin structure in which in the magnetoresistance effect element 100, the first ferromagnetic metal layer 101 that is laminated later and is disposed on a side far away from the substrate 110 becomes a magnetization-free layer, and the second ferromagnetic metal layer 103 that is laminated first and is disposed on a side close to the substrate 110 becomes a magnetization fixed layer (pin layer), but the structure of the magnetoresistance effect element 100 is not particularly limited, and a so-called top pin structure is also possible.

<Power Supply>

The magnetoresistance effect element 100 further includes a first power supply 140 that allows a current to flow in the lamination direction of the magnetoresistance effect element part 105, and a second power supply 150 that allows a current to flow to the spin-orbit torque wiring 120.

The first power supply 140 is connected to the wiring 130 and the spin-orbit torque wiring 120. The first power supply 140 can control a current that flows in the lamination direction of the magnetoresistance effect element 100.

The second power supply 150 is connected to both ends of the spin-orbit torque wiring 120. The second power supply 150 can control a current that is a current that flows in a direction orthogonal to the lamination direction of the magnetoresistance effect element part 105, that is, a current that flows to the spin-orbit torque wiring 120.

As described above, the current that flows in the lamination direction of the magnetoresistance effect element part 105 causes STT. In contrast, the current that flows to the spin-orbit torque wiring 120 causes SOT. Both the STT and the SOT contribute to magnetization reversal of the first ferromagnetic metal layer 101.

As described above, the amount of currents, which respectively flow in the lamination direction of the magnetoresistance effect element part 105 and in a direction that orthogonal to the lamination direction, is controlled by the two power supplies, and thus it is possible to freely control contribution rates of the SOT and the STT with respect to the magnetization reversal.

For example, in a case where it is difficult to flow a large current to a device, control may be performed so that the STT with high energy efficiency with respect to the magnetization reversal becomes a main type. That is, the amount of current that flows from the first power supply 140 may be increased, and the amount of current that flows from the second power supply 150 may be decreased.

In addition, for example, in a case where it is necessary to prepare a thin device, and thus it is necessary to make the thickness of the nonmagnetic layer 102 be small, it is required to reduce a current that flows to the nonmagnetic layer 102. In this case, the amount of current that flows from the first power supply 140 may be reduced, and the amount of current that flows from the second power supply 150 may be increased to enhance the contribution rate of the SOT.

A known power supply can be used as the first power supply 140 and the second power supply 150.

As described above, according to the magnetoresistance effect element of the disclosure in a case of the configuration using the STT type and the SOT type in combination, the contribution rate of the STT and the SOT can be freely controlled by the amount of currents which are supplied from the first power supply and the second power supply. According to this, it is possible to freely control the contribution rate of the STT and the SOT in correspondence with a performance that is required for a device, and thus the magnetoresistance effect element can function as a magnetoresistance effect element with relatively high general-purpose properties.

(Manufacturing Method)

A method of manufacturing the spin current magnetization rotational element and the magnetoresistance effect element including the spin current magnetization rotation element according to the embodiment of the disclosure is not particularly limited, and a known film formation method can be used. With regard to the film formation method, for example, as a physical vapor deposition (PVD) method, resistive heating deposition, electron beam deposition, a molecular beam epitaxy (MBE) method, an ion plating method, an ion beam deposition method, a sputtering method, and the like can be used. Alternatively, as a chemical vapor deposition (CVD) method, a thermal CVD method, an optical CVD method, a plasma CVD method, a metalorganic chemical vapor deposition (MOCVD) method, an atomic layer deposition (ALD) method, and the like can be used. In addition, a single atom layer doping method (delta doping method) can be used to form a very thin interface spin generation layer having a thickness that is two or less times an atomic radius. In the following description, description will be given of an example of a method of manufacturing the magnetoresistance effect element to which a spin-orbit torque type magnetization reversal element is applied, and the description is also true of a method of manufacturing a spin-orbit torque type magnetization reversal element.

First, the spin-orbit torque wiring is prepared on a substrate that becomes a support. For example, the spin conductive layer is formed by using an MBE method. For example, the interfacial spin generation layer is formed on the spin conduction layer by using a sputtering method in which adjustment is made to a low film formation rate. Then, a process of forming the spin conduction layer is repeated to obtain a lamination body in which the spin conduction layer and the interfacial spin generation layer are alternately laminated. Then, the spin-orbit torque wiring is processed into a predetermined shape by using a technology such as photolithography.

Then, a portion other than the spin-orbit torque wiring is covered with an insulating film such as an oxide film. An exposed surface of the spin-orbit torque wiring and the insulating film is preferably polished by a chemical-mechanical polishing (CMP).

Then, the magnetoresistance effect element is prepared. For example, the magnetoresistance effect element is prepared by using a sputtering method. In a case where the magnetoresistance effect element is the TMR element, for example, a tunnel barrier layer is formed as follows. First, a metal thin film including magnesium, aluminum, and divalent cations of a plurality of nonmagnetic elements is sputtered onto the first ferromagnetic metal layer in a thickness of approximately 0.4 to 2.0 nm, and plasma oxidation or natural oxidation due to introduction of oxygen is performed. Then, a heat treatment is performed.

It is preferable that the resultant laminated film that is obtained is subjected to an annealing treatment. A layer that is formed through reactive sputtering is amorphous, and thus it is necessary to crystallize the layer. For example, in a case of using Co—Fe—B as the ferromagnetic metal layer, a part of B is leaked due to the annealing treatment, and thus the layer is crystallized In the magnetoresistance effect element that is prepared through the annealing treatment, a magnetoresistance ratio is further improved in comparison to a magnetoresistance effect element that is prepared without being subjected to the annealing treatment. The reason for this is considered to be because uniformity in a crystal size and orientation of the tunnel barrier layer of the nonmagnetic layer are improved due to the annealing treatment.

With regard to the annealing treatment, it is preferable that heating is performed at a temperature of 300° C. to 500° C. for 5 minutes to 100 minutes in an inert atmosphere such as Ar, and heating is performed at a temperature of 100° C. to 500° C. for 1 hour to 10 hours in a state in which a magnetic field of 2 kOe to 10 kOe is applied.

As a method of shaping the magnetoresistance effect element into a predetermined shape, processing means such as photolithography can be used. First, the magnetoresistance effect element is laminated, and a surface, which is opposite to the spin-orbit torque wiring, of the magnetoresistance effect element is coated with a resist. Then, the resist in a predetermined portion is cured to remove the resist in an unnecessary portion. A portion in which the resist is cured becomes a protective film of the magnetoresistance effect element. The portion in which the resist is cured matches a shape of the magnetoresistance effect element that is finally obtained.

In addition, the surface on which the protective film is formed is subjected to a treatment such as ion milling and reactive ion etching (RIE). A portion in which the protective film is not formed is removed, and thus a magnetoresistance effect element having a predetermined shape is obtained.

The disclosure is not limited to the configuration of the spin-orbit torque type magnetization reversal element according to the embodiment, and the manufacturing method thereof, and various modifications can be made in a range not departing from the gist of the disclosure.

(Magnetic Memory)

A magnetic memory (MRAM) according to an embodiment of the disclosure includes a plurality of the magnetoresistance effect elements according to the embodiment of the disclosure.

(Magnetization Reversal Method)

In the magnetoresistance effect element according to the embodiment of the disclosure, in a case of performing magnetization reversal, it is preferable that a current density that is allowed to flow to the spin-orbit torque wiring is set to be less than $1 \times 10^7$ A/cm$^2$. When the current density of the current that is allowed to flow to the spin-orbit torque wiring is excessively large, heat is generated due to the current that flows to the spin-orbit torque wiring. When heat is applied to the second ferromagnetic metal layer, magnetization stabilization of the second ferromagnetic metal layer disappears, and magnetization reversal that is not assumed, and the like may occur. When the magnetization reversal that is not assumed occurs, a problem that recorded information is updated occurs. That is, it is preferable that the current density of the current that is allowed to flow to the spin-orbit torque wiring is not excessively large so as to avoid the magnetization reversal that is not assumed. When the current density of the current that is allowed to flow to the spin-orbit torque wiring is less than $1 \times 10^7$ A/cm$^2$, it is possible to avoid at least occurrence of the magnetization reversal due to heat that is generated.

With regard to the magnetization reversal method, in the magnetoresistance effect element according to the embodiment of the disclosure, in a case of a configuration in which the STT type and the SOT type are used in combination, a current may be applied by a power supply of the magnetoresistance effect element after applying a current by a power supply of the spin-orbit torque wiring.

An SOT magnetization reversal process and an STT magnetization reversal process may be simultaneously performed, or the STT magnetization reversal process may be additionally performed after performing the SOT magnetization reversal process in advance. A current may be supplied simultaneously from the first power supply 140 and the second power supply 150, or a current may be additionally supplied from the first power supply 140 after supplying a current from the second power supply 150. However, it is preferable that a current is applied by the power supply of the magnetization effect element after applying a current by the power supply of the spin-orbit torque wiring to obtain an assist effect of the magnetization reversal by using the SOT in a more reliable manner. That is, it is preferable that a current is additionally supplied from the first power supply 140 after supplying a current from the second power supply 150.

INDUSTRIAL APPLICABILITY

According to the spin current magnetization rotational element of the disclosure, it is possible to reduce a current density that is necessary for magnetization rotation, and it is also possible to reduce power consumption.

REFERENCE SIGNS LIST

1 First ferromagnetic metal layer
2 Spin-orbit torque wiring
3 Spin conduction layer
4 Interfacial spin generation layer
10 Spin current magnetization rotational element (spin current magnetization reversal element)
100 Magnetoresistance effect element
101 First ferromagnetic metal layer
102 Nonmagnetic layer
103 Second ferromagnetic metal layer
104 Cap layer
105 Magnetoresistance effect element portion
110 Substrate
120 Spin-orbit torque wiring
130 Wiring
140 First power supply
150 Second power supply

The invention claimed is:

1. A spin current magnetization rotational element, comprising:
   a first ferromagnetic metal layer for a magnetization direction to be changed; and
   a spin-orbit torque wiring which extends in a second direction intersecting a first direction that is a plane-orthogonal direction of the first ferromagnetic metal layer, the first ferromagnetic metal layer being located on one surface of the spin-orbit torque wiring
   wherein the spin-orbit torque wiring has a structure in which a spin conduction layer and an interfacial spin generation layer are alternately laminated in the first direction,
   a number of a plurality of the interfacial spin generation layers is two or greater, and
   in the spin-orbit torque wiring, one of the plurality of interfacial spin generation layers is closest to the first ferromagnetic metal layer.

2. The spin current magnetization rotational element according to claim 1,
   wherein the thickness of each of the plurality of interfacial spin generation layers is two or less times an atomic radius of an atom that constitutes the interfacial spin generation layer.

3. The spin current magnetization rotational element according to claim 1,
   wherein the spin conduction layer is constituted by a material that includes at least any one kind of element among Al, Si, Cu, Ag, GaAs, and Ge.

4. The spin current magnetization rotational element according to claim 3,
   wherein the plurality of interfacial spin generation layers are constituted by a material that includes any element among Mo, Ru, Rh, Pd, Ta, W, Ir, Pt, Au, or Bi.

5. The spin current magnetization rotational element according to claim 3,
   wherein the thickness of the spin conduction layer is equal to or less than a spin diffusion length of the spin conduction layer.

6. The spin current magnetization rotational element according to claim 3,
   wherein among the plurality of interfacial spin generation layers, the thickness of the interfacial spin generation layer closest to the first ferromagnetic metal layer is smaller than the thickness of the other interfacial spin generation layers.

7. The spin current magnetization rotational element according to claim 3,
   wherein a plurality of the spin conduction layers are constituted by materials different from each other in a state in which each of the interfacial spin generation layers is interposed between the plurality of spin conduction layers, and
   a spin resistivity of a spin conduction layer close to the first ferromagnetic metal layer is smaller than a spin resistivity of a spin conduction layer distant from the first ferromagnetic metal layer.

8. The spin current magnetization rotational element according to claim 3,
   wherein when viewed from the first direction, a cross-sectional area of the interfacial spin generation layer closest to the first ferromagnetic metal layer is smaller than a cross-sectional area of the other interfacial spin generation layers which are not closest to the first ferromagnetic metal layer.

9. The spin current magnetization rotational element according to claim 1,
   wherein the plurality of interfacial spin generation layers are constituted by a material that includes any element among Mo, Ru, Rh, Pd, Ta, W, Ir, Pt, Au, or Bi.

10. The spin current magnetization rotational element according to claim 9,
    wherein among the plurality of interfacial spin generation layers, the thickness of the interfacial spin generation layer closest to the first ferromagnetic metal layer is smaller than the thickness of the other interfacial spin generation layers.

11. The spin current magnetization rotational element according to claim 9,
    wherein when viewed from the first direction, a cross-sectional area of the interfacial spin generation layer closest to the first ferromagnetic metal layer is smaller than a cross-sectional area of the other interfacial spin generation layers which are not closest to the first ferromagnetic metal layer.

12. The spin current magnetization rotational element according to claim 1,
    wherein the thickness of the spin conduction layer is equal to or less than a spin diffusion length of the spin conduction layer.

13. The spin current magnetization rotational element according to claim 1,
    wherein among the plurality of interfacial spin generation layers, the thickness of the interfacial spin generation layer closest to the first ferromagnetic metal layer is smaller than the thickness of the other interfacial spin generation layers.

14. The spin current magnetization rotational element according to claim 13,
    wherein when viewed from the first direction, a cross-sectional area of the interfacial spin generation layer closest to the first ferromagnetic metal layer is smaller than a cross-sectional area of the other interfacial spin generation layers which are not closest to the first ferromagnetic metal layer.

15. The spin current magnetization rotational element according to claim 1,
- wherein a plurality of the spin conduction layers are constituted by materials different from each other in a state in which each of the interfacial spin generation layers is interposed between the plurality of spin conduction layers, and
- a spin resistivity of a spin conduction layer close to the first ferromagnetic metal layer is smaller than a spin resistivity of a spin conduction layer distant from the first ferromagnetic metal layer.

16. The spin current magnetization rotational element according to claim 1,
- wherein when viewed from the first direction, a cross-sectional area of the interfacial spin generation layer closest to the first ferromagnetic metal layer is smaller than a cross-sectional area of the other interfacial spin generation layers which are not closest to the first ferromagnetic metal layer.

17. The spin current magnetization rotational element according to claim 1,
- wherein the thickness of the spin-orbit torque wiring is 20 nm or less.

18. A magnetoresistance effect element, comprising:

the spin current magnetization rotational element according to claim 1;

a second ferromagnetic metal layer in which a magnetization direction is fixed; and a nonmagnetic layer that is interposed between the first ferromagnetic metal layer and the second ferromagnetic metal layer.

19. A magnetic memory, comprising:

a plurality of the magnetoresistance effect elements according to claim 18.

* * * * *